(12) United States Patent
Kwon et al.

(10) Patent No.: US 6,483,162 B2
(45) Date of Patent: Nov. 19, 2002

(54) SEMICONDUCTOR DEVICE HAVING IMPROVED METAL LINE STRUCTURE AND MANUFACTURING METHOD THEREFOR

(75) Inventors: Dong-chul Kwon, Suwon (KR); Young-jin Wee, Seoul (KR); Hong-jae Shin, Seoul (KR); Sung-jin Kim, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/785,442

(22) Filed: Feb. 20, 2001

(65) Prior Publication Data

US 2001/0006255 A1 Jul. 5, 2001

Related U.S. Application Data

(62) Division of application No. 09/339,375, filed on Jun. 24, 1999, now Pat. No. 6,333,260.

(30) Foreign Application Priority Data

Jun. 24, 1998 (KR) ............................................. 98-23920

(51) Int. Cl.⁷ ............................................... H01L 23/48
(52) U.S. Cl. ...................... 257/437; 257/774; 257/758; 257/759; 257/764
(58) Field of Search ................................. 257/774, 758, 257/759, 763, 764, 765, 437

(56) References Cited

U.S. PATENT DOCUMENTS

| | | | | |
|---|---|---|---|---|
| 5,858,869 A | * | 1/1999 | Chen et al. | 438/597 |
| 5,939,771 A | * | 8/1999 | Usami et al. | 257/643 |
| 6,034,418 A | * | 3/2000 | Matsuura | 257/632 |
| 6,046,502 A | * | 4/2000 | Matsuno | 257/751 |
| 6,060,382 A | | 5/2000 | Lee | 438/622 |
| 6,268,657 B1 | * | 7/2001 | Watanabe et al. | 257/759 |
| 6,355,983 B2 | * | 3/2002 | Graas et al. | 257/763 |

FOREIGN PATENT DOCUMENTS

JP        9-148433        6/1997

* cited by examiner

Primary Examiner—Kamand Cuneo
Assistant Examiner—Lourdes Cruz
(74) Attorney, Agent, or Firm—Lee & Sterba, P.C.

(57) ABSTRACT

A semiconductor device having improved metal line structure has a first dielectric layer formed on a semiconductor substrate, a metal film pattern formed on the first dielectric layer, an interface protection layer on the metal film pattern, and a second dielectric layer on the interface protection layer, wherein the second dielectric layer contains a reactive material, e.g., fluorine, which is prevented by the interface protection layer from diffusing to the metal film pattern and reacting with the metal in the metal film pattern to form a damage film, e.g., metal fluoride, which is a highly resistive material that, if formed on the semiconductor device, would reduce the reliability of the metal film pattern and thus reduce the reliability of the semiconductor device as a whole.

9 Claims, 4 Drawing Sheets

SEMICONDUCTOR DEVICE HAVING IMPROVED METAL LINE STRUCTURE AND MANUFACTURING METHOD THEREFOR

This application is a divisional of application Ser. No. 09/339,375, filed Jun. 24, 1999, now U.S. Pat. No. 6,333,260.

BACKGROUND OF THE INVENTION

1. Field of the Invention

The present invention relates generally to a semiconductor device and, more particularly, to a semiconductor device having improved metal line structure and a manufacturing method therefor.

2. Description of the Related Art

As semiconductor devices, particularly logic devices, have become more highly integrated and operate at higher speeds, the design rule has decreased to 0.25 microns or less. Accordingly, the width of metal lines and the spacing or interval between metal lines on the semiconductor devices have become narrower. However, with a decrease in the width of the metal line, the resistance of the metal line increases, and with a reduction in the spacing or interval between metal lines, the parasitic capacitance between the metal lines increases. Such an increase in resistance or parasitic capacitance can significantly reduce the speed of a semiconductor device, especially in a logic device.

In order to suppress an increase in capacitance between the metal lines, a dielectric material having a low dielectric constant k is required to be used as an interlayered dielectric material or an intermetallic dielectric material. There are two basic types of dielectric materials having a low dielectric constant k: an organic material and an inorganic material. Silicon oxyfluoride (SiOF) is an example of an inorganic material that exhibits a low dielectric constant. This material may be formed by a high density plasma process or other processes.

FIGS. 1 and 2 are cross-sectional views for illustrating the problems and shortcomings of a conventional metal line structure.

Referring to FIG. 1, when a SiOF film is used as a dielectric film 40 covering an anti-reflection layer 35 and a metal film pattern 31 formed on a dielectric layer 20 and a semiconductor substrate 10, the metal film pattern 31 is subject to attack by a harmful or reactive material, such as fluorine, contained in the dielectric film 40, resulting in the generation of a damage film 37. More specifically, a harmful material or reactive material, such as fluorine, diffuses to the metal film pattern 31 and reacts with metal elements in the metal film pattern 31 to form the damage film 37. As a product of such a reaction, the damage film 37 is formed of a metal fluoride, a highly resistive material. The formation of the damage film 37 may therefore cause an increase in the resistance of the metal film pattern 31, thereby degrading the reliability of the metal line and causing a failure of the semiconductor device.

Meanwhile, damage to the metal film pattern 31 as described above may also occur in a metal line fabrication process including a process for forming a via contact plug, etc. Referring to FIG. 2, when an upper metal film 55 to be connected to a lower metal film pattern 31 is formed, the lower metal film pattern 31 may be damaged by a source gas which is used to form the upper metal film 55 or by a reactive material produced by the source gas, thereby producing a damage film 39 on the lower metal film pattern 31.

For example, when the upper metal film 55 is a tungsten film, the tungsten film is formed from a reactive gas including source gases such as tungsten hexafluoride ($WF_6$). A contact hole exposing the lower metal film pattern 31 is formed by selectively etching the first and second dielectric films 40 and 45. Since semiconductor devices are highly integrated, it is difficult to accurately align the contact holes with respect to the lower metal film pattern 31 when the contact holes are formed. In particular, when via contact holes are formed in a logic device, misalignment may occur due to a very small edge portion. Accordingly, a sidewall surface of the lower metal film pattern 31 is generally exposed together with the upper surface of the lower metal film pattern 31.

The upper portion of the lower metal film pattern 31 and the bottom surface of the contact hole form a recess (A) because of the misalignment. Because the recess (A) has a significant high aspect ratio, the step coverage of a glue layer 51 is weakened. This degradation in the step coverage may generate a step coverage failure so that the sidewall surface of the lower metal film pattern 31 may be exposed.

The exposed sidewall surface of the lower metal film pattern 31 contacts a source gas such as a tungsten hexafluoride gas introduced when the upper metal film 55 is formed, or a reactive material such as fluorine produced by the source gas. The reactive material, e.g., fluorine, is diffused into the lower metal film pattern 31, and reacts with the metal of the lower metal film pattern 31, thus forming a highly resistive material 39 such as a metal fluoride. Therefore, a resistance failure may occur in which the resistance of the lower metal film increases or the contact resistance between the upper metal film 55 and the lower metal film pattern 31 increases, resulting in a failure of the semiconductor device.

The present invention is directed to overcoming or at least reducing the effects of one or more of the problems set forth above.

SUMMARY OF THE INVENTION

In accordance with one aspect of the present invention, there is provided a semiconductor device comprising a first dielectric layer formed on a semiconductor substrate, a metal film pattern formed on the first dielectric layer, an interface protection layer formed on the metal film pattern, and a second dielectric layer formed on the interface protection layer. The interface protection layer may be formed of aluminum oxide, silicon nitride or silicon oxynitride and prevents any reactive material in the second dielectric layer from diffusing to and attacking or reacting with the metal film pattern, especially when the reactive material is fluorine as may be the case when the second dielectric layer is formed of silicon oxyfluoride (SiOF).

In accordance with another aspect of the present invention, there is provided a semiconductor device comprising a first dielectric layer formed on a semiconductor substrate, a first metal film pattern formed on the first dielectric layer, an interface protection layer formed on the first metal film pattern, a second dielectric layer formed on the interface protection layer, a contact hole extending through the second dielectric layer and the interface protection layer to the first metal film pattern, a protection spacer covering the side walls of the contact hole, an adhesion layer formed on the second dielectric layer and along the side walls and bottom walls of the contact hole, and a second metal layer formed on the adhesion layer and extending into the contact hole.

The second dielectric layer is a dielectric layer, e.g., a silicon oxyfluoride layer, containing a reactive material, such as fluorine. The adhesion layer is formed on the exposed first metal film pattern and may be a double layer formed by stacking a titanium layer and a titanium nitride layer.

The interface protection layer may be formed of aluminum oxide, silicon nitride or silicon oxynitride and prevents any reactive material in the second dielectric layer from diffusing to and attacking or reacting with the metal film pattern, especially when the reactive material is fluorine as may be the case when the second dielectric layer is formed of silicon oxyfluoride (SiOF). It is preferable that the interface protection layer be formed of aluminum oxide.

In accordance with yet another aspect of the present invention, there is provided a method of manufacturing a metal line structure for semiconductor devices, by which the resistance of a metal film pattern can be prevented from increasing by protecting the metal film pattern from damage due to harmful or reactive material contained in a dielectric film.

In accordance with still another aspect of the present invention, there is provided a method of manufacturing a metal line structure for semiconductor devices, by which the contact resistance between a lower metal film pattern and an upper metal film can be prevented from increasing by protecting the lower metal film pattern from damage due to a reactive material contained in a source gas which is used to form the upper metal film to contact the lower metal film pattern.

In the method of manufacturing a metal line structure for a semiconductor device, first, a metal film pattern is formed on the first dielectric layer on a semiconductor substrate. A second dielectric layer for insulating the metal film pattern is formed. The second dielectric layer is an insulative layer, e.g., a silicon oxyfluoride (SiOF) layer, containing a reactive material, such as fluorine, which reacts with the metal film pattern. The silicon oxyfluoride is formed by high density plasma chemical vapor deposition.

An interface protection layer is formed at the interface between the second dielectric layer and the metal film pattern, to protect the metal film pattern by preventing the reactive material, e.g., fluorine, from being diffused from the second dielectric layer to the metal film pattern. The interface protection layer is formed of a material selected from the group consisting of aluminum oxide, silicon nitride, and silicon oxynitride, to cover the metal film pattern. Preferably, the interface protection layer is formed of aluminum oxide.

The interface protection layer may be formed by sequentially depositing multiple aluminum oxide sublayers. For example, the aluminum oxide interface protection layer is formed by atomic layer deposition. If a silicon nitride layer or the silicon oxynitride layer is used, then it may be formed by chemical vapor deposition or plasma deposition.

In still another aspect of the present invention, there is provided a method of manufacturing a semiconductor device having an improved line structure, wherein a first metal film pattern is formed on a first dielectric layer on a semiconductor substrate. A second dielectric layer having a contact hole exposing the first metal film pattern is formed to insulate the first metal film pattern. The second dielectric layer is formed of a dielectric material, e.g., silicon oxyfluoride (SiOF), containing a reactive material, such as fluorine, which reacts on the first metal film pattern. The silicon oxyfluoride is formed by high density plasma chemical vapor deposition.

An interface protection layer is formed at the interface between the second dielectric layer and the metal film pattern, to protect the metal film pattern by preventing the reactive material, e.g., fluorine, from being diffused from the second dielectric layer to the first metal film pattern. The interface protection layer is a layer selected from the group consisting of aluminum oxide, silicon nitride, and silicon oxynitride, covering the first metal film pattern. Preferably, the aluminum oxide layer is used as the interface protection layer.

The interface protection layer may be formed by sequentially depositing multiple aluminum oxide sublayers. If a silicon nitride layer or silicon oxynitride layer is used, then it may be formed by chemical vapor deposition or plasma deposition.

A protection spacer is formed of a material selected from the group consisting of aluminum oxide, silicon nitride, and silicon oxynitride within the contact hole, to protect the exposed first metal film pattern by covering the sidewall of the contact hole and the sidewall of the exposed first metal film pattern while exposing the upper surface of the first metal film pattern.

The step of forming the protection spacer includes the steps of forming a protection layer for covering the first metal film pattern, in the contact hole, and exposing the upper surface of the first metal film pattern by anisotropically etching the protection layer. The anisotropic etching is performed by an inductively coupled plasma method or RF sputtering method.

The interface protection layer may be formed by sequentially depositing multiple aluminum oxide sublayers. For example, the interface protection layer is formed by atomic layer deposition. Also, the silicon nitride layer or silicon oxynitride layer is formed by chemical vapor deposition or plasma deposition.

A contact layer is formed on the exposed first metal film pattern in the contact hole. The contact layer prefeerably comprises an adhesion layer and a second metal layer. The adhesion layer preferably comprises a double layer formed by stacking a titanium layer and a titanium nitride layer.

A second metal layer for filling the contact hole is formed using a tungsten layer on the adhesion layer. The tungsten layer is formed using a gas, such as tungsten hexafluoride gas, containing a reactive material, e.g., fluorine, which reacts on the first metal film pattern. Here, the protection spacer protects the first metal film pattern from the reactive material, e.g., fluorine.

According to the present invention, a metal film pattern to be used as a interconnection line can be protected from damage due to movement of a harmful or reaction material contained in a dielectric film. Also, the lower portion of the metal film pattern can be protected from damage due to diffusion or other movements of a reactive material contained in a source gas which is used when another metal film to contact the metal film pattern is formed. Therefore, the resistance of the metal film pattern can be prevented from increasing, and likewise for the contact resistance between the metal film pattern and another upper metal film.

BRIEF DESCRIPTION OF THE DRAWINGS

The above objects and advantages of the present invention will become more apparent upon reference to the following detail description of specific embodiments and the attached drawings, of which.

DETAILED DESCRIPTION OF THE PREFERRED EMBODIMENT

Figure 1:
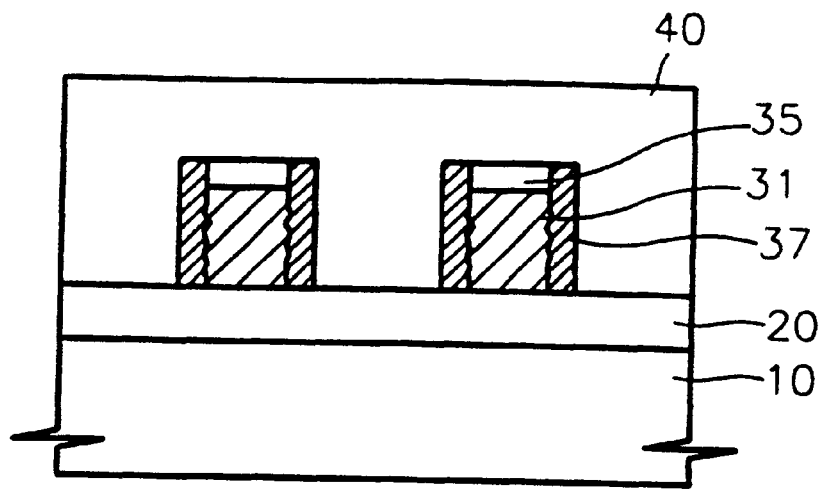
FIGS. 1 and 2 are cross-sectional views of a conventional metal line structure.
Figure 2:
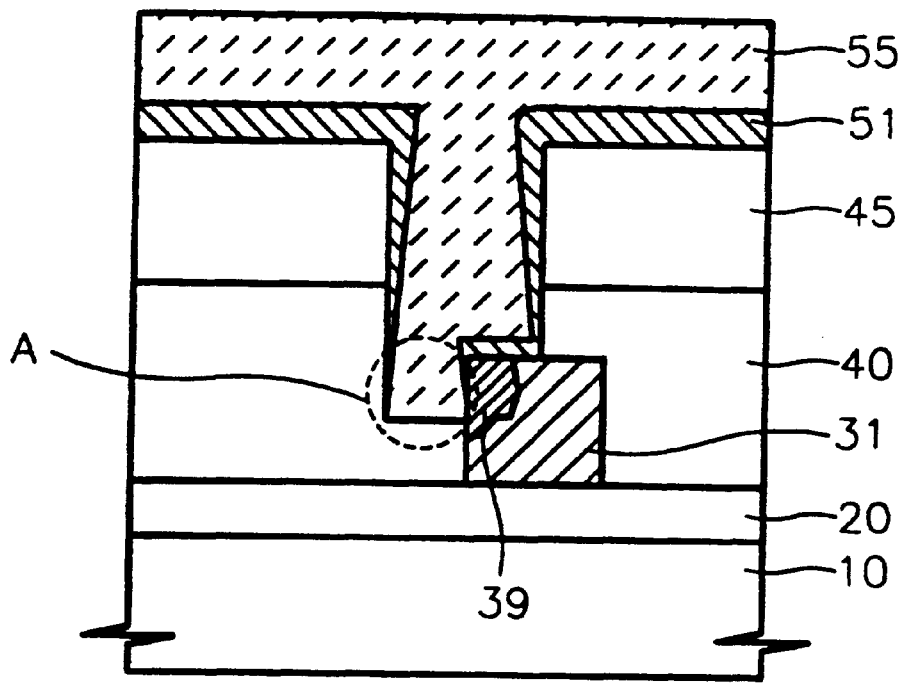

Korean Application No. 98-23920 discloses the same subject matter as the present application and is hereby incorporated by reference as if fully set forth herein.

Hereinafter, embodiments of the present invention will be described in detail with respect to the attached drawings. However, the embodiments of the present invention can be modified into various other forms, and the scope of the present invention must not be interpreted as being restricted to the embodiments. The embodiments are provided to more completely explain the present invention to those skilled in the art. In the drawings, the thicknesses of layers or regions are exaggerated for clarity. Like reference numerals in the drawings denote the same members.

First Embodiment

Figure 3:
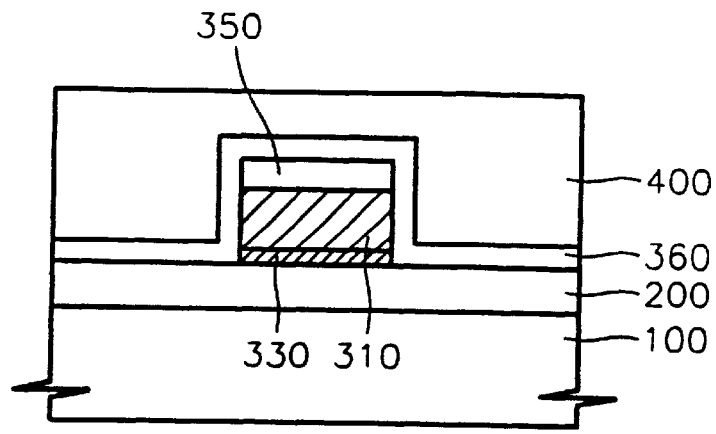
FIG. 3 is a cross-sectional view of a metal line structure of a semiconductor device according to a first embodiment of the present invention.

Referring to FIG. 3, a metal film pattern 310 is used as an interconnection line and is electrically insulated by a first dielectric layer 200 from a sub-structure such as a capacitor structure or a transistor structure formed on a semiconductor substrate 100. The metal film pattern 310 is formed of tungsten (W), copper (Cu), aluminum (Al), tungsten alloy, copper alloy, or an aluminum alloy.

A diffusion barrier layer 330 may be provided between the metal film pattern 310 and the first dielectric layer 200 to prevent the movement of a material to a lower film. The diffusion barrier layer 330 may be formed of titanium (Ti), titanium nitride (TiN), or tungsten silicide (WSi$_x$). Alternatively, the diffusion barrier layer 330 may be a multilayered combination with each layer being formed of one of the above materials.

An anti-reflection layer 350 may be further formed on the metal film pattern 310. The anti-reflection layer 350 may be formed of titanium or titanium nitride and may be either a single layer or a multilayered combination with each layer being formed of one of these materials.

A second dielectric layer 400 insulates the metal film pattern 310 from other metal lines (not shown). The second dielectric layer 400 is formed of a dielectric material having a low dielectric constant k to suppress an increase in capacitance between metal lines as the space or interval between the metal lines is made more narrow. For example, the second dielectric layer 400 is an inorganic material layer containing fluorine, such as a SiOF layer formed by a high density plasma method (hereinafter, called "HDP-SiOF layer").

The second dielectric layer 400, however, may have harmful or reactive materials such as fluorine, which may diffuse to and react with the metal film pattern 310 and thereby damage the metal film pattern 310. For example, fluorine in the second dielectric layer 400 may diffuse into the metal film pattern 310 and react with the metal element of the metal film pattern 310 to form a metal fluoride. The metal fluoride is highly resistive and may reduce the reliability and conductivity of the metal film pattern 310. Therefore, in order to protect the metal film pattern 310 from reactive material such as fluorine, an interface protection layer 360 is provided between the metal film pattern 310 and the second insulative film 400.

The interface protection layer 360 is formed on the metal film pattern 310 and is formed of a material capable of preventing diffusion harmful or reactive material such as fluorine. For example, the interface protective layer 360 may be made from aluminum oxide (Al$_2$O$_3$), silicon nitride (SiN), or silicon oxynitride (SiON) in layer form that covers the metal film pattern 310.

The effect of the SiN or SiON layer is demonstrated by the results shown in Table 1. Table 1 shows the resistances of the metal film pattern 310 before and after a thermal stress is applied to the second dielectric layer 400 for about 100 hours at a temperature of about 350° C. Example Nos. 1 and 2 indicate the case when the interface protection layer 360 is not introduced, and Example Nos. 3 and 4 indicate the case when the interface protection layer 360 is introduced.

TABLE 1

| | Variation in Resistance of Metal Line According to Type of Dielectric Layer | | | |
|---|---|---|---|---|
| EX-AM-PLE | Type of dielectric layer | Initial Resistance (× E-2 ohm) of metal line | Resistance (× E-2 ohm) of metal line after applying thermal stress | Rate of increment (%) |
| 1 | USG (Undoped Silicate Glass) layer | 6.22 | 6.4 | 2.9 |
| 2 | HDP-SiOF layer | 6.22 | 6.49 | 4.3 |
| 3 | PE-SiN layer/HDP-SiOF layer | 6.4 | 6.13 | −4.2 |
| 4 | PE-SiON layer/HDP-SiOF layer | 6.22 | 6.22 | 0 |

Referring to Table 1, it can be seen that when a general USG film is used as a dielectric film, the resistance of a metal line increases by about 2.9% under the above thermal stress conditions. It can also be seen that the resistance of the metal line increases by about 4.3% in the case of the HDP-SiOF layer. However, when a SiON or SiN layer according to a first embodiment of the present invention is used as the interface protection layer 360 with respect to an SiOF layer, the resistance of the metal line does not increase. Accordingly, use of an interface protection layer 360 according to the present invention prevents damage to the metal film pattern 310 by preventing fluorine in the SiOF layer from diffusing to the metal film pattern 310.

A method of manufacturing the metal line structure according to the first embodiment of the present invention described above will now be described in detail, referring to FIGS. 4 and 5.

Figure 4:
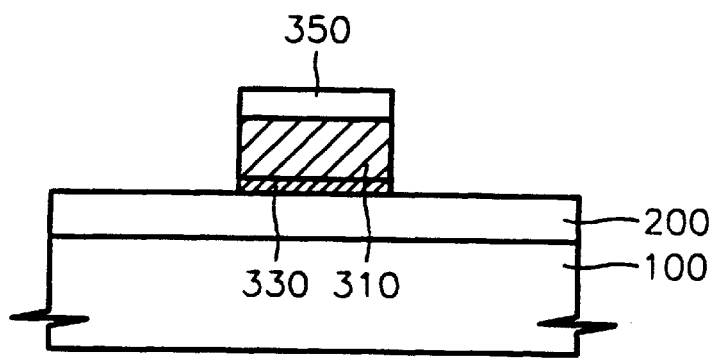
FIGS. 4 and 5 are cross-sectional views of a metal line structure of a semiconductor device, illustrating a method of forming the metal line structure shown in FIG. 3.

Referring to FIG. 4, a first dielectric layer 200 is formed on a semiconductor substrate 100. A diffusion barrier layer 330 is formed on the first dielectric layer 200 to prevent movement of a material. The diffusion barrier layer 330 may be formed of titanium, titanium nitride or tungsten silicide. Alternatively, the diffusion barrier layer 330 may be a multilayered combination with each layer being formed of one of the above materials.

A metal layer 310 to be electrically connected to the semiconductor substrate 100 via contact holes is formed on the diffusion barrier layer 330 on the first dielectric layer 200. The metal layer 310 is formed of tungsten, copper, aluminum, tungsten alloy, copper alloy, or aluminum alloy.

An anti-reflection layer 350 is formed on the metal layer to suppress reflection of light from the surface of the metal layer 310 when the metal layer 310 is finely patterned. A photoresist pattern is formed on the antireflection layer 350, and the antireflection layer 350, the metal layer 310, and the diffusion barrier layer 330 are patterned by using the photoresist pattern as an etch mask. A metal film pattern 310 to be used as an interconnection line is formed through such a selective patterning process.

Figure 5:
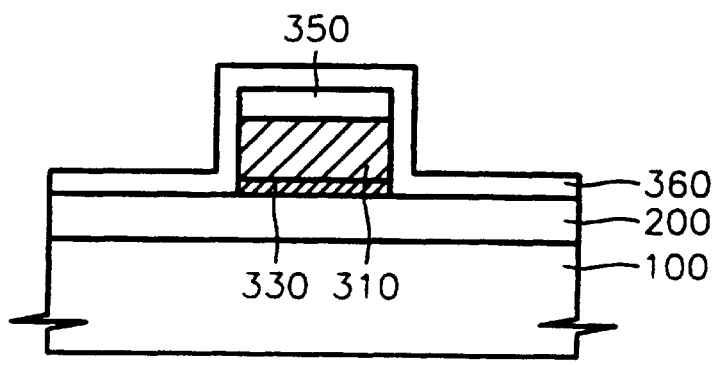

Referring to FIG. 5, an interface protection layer 360 is formed of a material which can prevent movement or diffusion of a material to the exposed surfaces of the anti-reflection layer 350, metal film pattern 310 and diffusion barrier layer 330. The interface protection layer 360 may be formed of, for example, aluminum oxide, SiN or SiON.

The aluminum oxide layer is formed by a method by which excellent step coverage can be accomplished to overcome the step difference generated by the lower metal film 310, the antireflection layer 350, and or the diffusion barrier layer 330. For example, when an aluminum oxide layer having a predetermined thickness is formed to serve as the interface protection layer 360, the predetermined thickness is obtained by stacking multiple aluminum oxide films that are thinner than the predetermined thickness. Various different methods may be used in obtaining the aluminum oxide layer having the predetermined thickness, and as an example, an atomic layer deposition (ALD) method may be used. The ALD method sequentially deposits a gas phase reactive material produced by a source material on the metal film pattern 310.

A vaporized aluminum source material such as tri-methyl aluminum $AL(CH_3)_3$ or aluminum chloride $AlCl_3$ may be used as the source material. The gas phase material formed by the aluminum source material is deposited on the metal film pattern 310. Thus, a thin aluminum layer having a thickness that may be as small as an atom is formed. The aluminum layer is oxidized by flowing an oxidizing gas, such as oxygen over the aluminum layer. Accordingly, an aluminum oxide layer is formed to a thickness that is as small as an atom, e.g., to a thickness of about 2 Å to 50 Å. An aluminum oxide layer required as the interface protection layer 360 is formed by repeating the step of forming the thin aluminum oxide layer having a thickness that is as small as an atom. For example, an aluminum oxide layer as the interface protection layer 360 is formed to a thickness of about 100 Å to 1000 Å. Here, the process for forming the aluminum oxide layer using the ALD method is performed at a temperature between about 150° C. and 500° C., preferably, at a temperature between about 350° C. and 400° C.

The aluminum oxide layer formed as described above can accomplish a high step coverage by virtue of the process characteristics of the ALD method. Thus, the aluminum oxide layer can overcome the step difference generated by the metal film pattern 310, the antireflection layer 350, and/or the diffusion barrier layer 330, and cover the metal film pattern 310 without a failure in coating integrity.

The SiN or SiON layer can be formed by chemical vapor deposition or plasma deposition. For example, the interface protection layer 360 can be a PE-SiN or PE-SiON layer. It is preferable that the SiN or SiON layer is formed to a thickness of about 500 Å.

A second dielectric layer 400 covering the interface protection layer 360 is formed as shown in FIG. 3, and insulates or shields the metal film pattern 310 from other metal lines. The second dielectric layer 400 is formed of a dielectric material having a low dielectric constant k. For example, the second dielectric layer 400 is an inorganic material layer such as a SiOF layer formed by a high density plasma deposition method. The SiOF layer is deposited at a temperature between about 350° C. and 400° C. using a plasma deposition method. Also, the SiOF layer is formed to a thickness which at least completely covers the metal film pattern.

The second dielectric layer 400 contains a harmful or reactive material such as fluorine which can damage the metal film pattern. However, in the first embodiment of the present invention, since the interface protection layer 360 is installed on the interface between the metal film pattern 310 and the second dielectric layer 400, movement or diffusion of the harmful or reactive material from the second dielectric layer 400 to the metal film pattern 310 is avoided. Accordingly, the metal film pattern 310 is preserved and prevented from damage or oxidation. In this manner and in accordance with the present invention, an increase in the resistance of the metal film pattern 310 as shown in Table 1 is suppressed.

Second Embodiment

The second embodiment is different from the first embodiment in that in a process for forming an upper metal layer to be connected to a lower metal film pattern, such as a via contact process, a protection layer for protecting a lower metal line in a contact hole is formed to prevent the lower metal film pattern from being damaged while forming the upper metal line. The reference numerals that will be used in describing this second embodiment correspond to the reference numerals that were used in describing the first embodiment, above.

Figure 6:
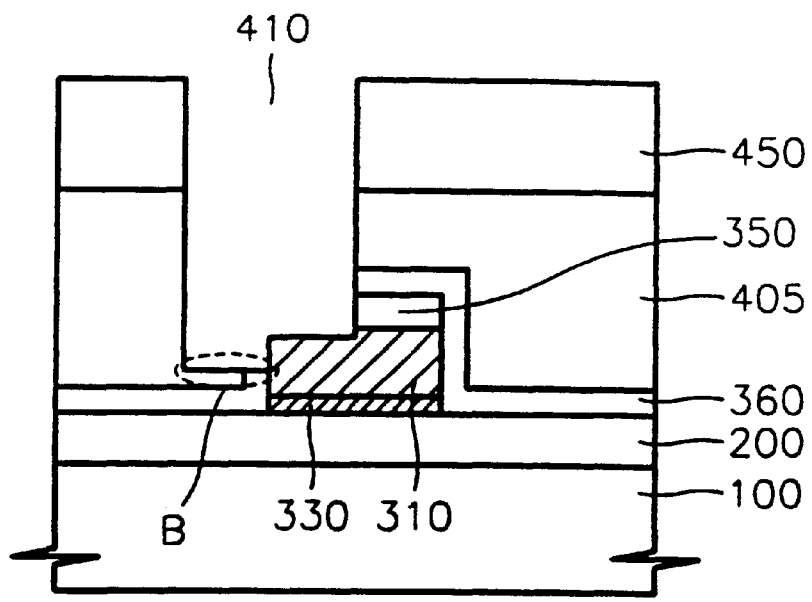
FIGS. 6 through 9 are cross-sectional views of a metal line structure of a semiconductor device according to a second embodiment of the present invention and a manufacturing method therefor.

Referring to FIG. 6, a first dielectric layer 200 is formed on the semiconductor substrate 100. The diffusion barrier layer 330, the first metal film pattern 310, and the antireflection layer 350 constituting a lower metal film pattern may be formed in the same way as the first embodiment. Second and third dielectric layers 405 and 450 for insulating and shielding the first metal film pattern 310 are formed. The second or third dielectric layer 405 or 450 can be formed of an SiOF layer as in the first embodiment of the present invention.

The interface protection layer 360 is formed of an aluminum oxide layer, an SiN layer or an SiON layer as in the first embodiment, on the interface between the second dielectric layer 405 and the first metal film pattern 310. Thus, the first metal film pattern 310 is protected from damage by a harmful or reactive material, e.g., fluorine, contained in the second dielectric layer 405.

The third and second dielectric layers 450 and 405 are selectively patterned, thus forming a contact hole 410 exposing the first metal film pattern 310. For example, the third and second dielectric layers 450 and 405, the interface protection layer 360, and the antireflection layer 350 are etched until the upper surface of the first metal film pattern 310 is sufficiently exposed. Thus, the upper surface of the lower first metal film pattern 310 is exposed.

When the contact hole 410 is formed, misalignment easily occurs, so that the contact hole 410 may expose even a part of the sidewall surface of the first metal film pattern 310. Accordingly, a step difference occurs between the most bottom surface of the contact hole 410 and the upper surface of the first metal film pattern 310.

Therefore, a recess (B) formed by the step difference between the bottom surface of the contact hole 410 and the upper surface of the first metal film pattern 310 has a high aspect ratio, e.g., an aspect ratio of 2 or greater. Also, in a subsequent process for forming an adhesion layer, coating failure in which the adhesion layer is not deposited in the hole may occur. Thus, during a subsequent process for forming a second metal layer for filling the contact hole 410, the exposed sidewall of the first metal film pattern 310 may be damaged.

Figure 7:
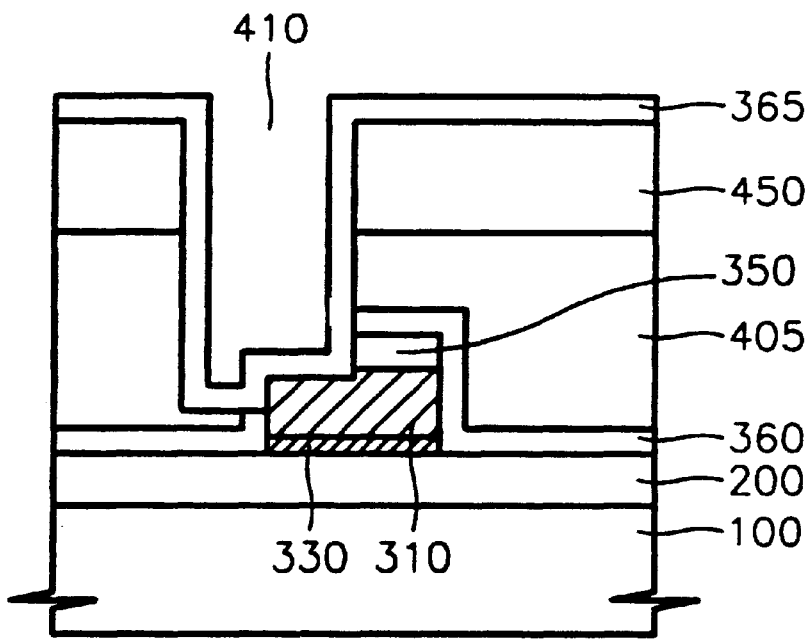

Referring to FIG. 7, a protection layer 365 covering the first metal film pattern 310 is formed in the contact hole 410 to prevent damage to the sidewall of the first metal film pattern 310. The protection layer 365 protects the exposed surface of the first metal film pattern 310 from the reactive material. An aluminum oxide layer formed by the ALD can be used as the protection layer 365. Also, a SiN or SiON layer formed by plasma deposition or chemical vapor deposition can be used as the protection layer 365.

The aluminum oxide layer can have a high step coverage by virtue of the process characteristics of the ALD method as described in the description of the first embodiment. Thus, the aluminum oxide layer can be deposited without loss of coating integrity or a coverage failure on the inner sidewall surface and bottom surface of the hole formed by the misalignment. That is, the aluminum oxide layer can cover the exposed sidewall surface of the first metal film pattern 310. Furthermore, since the aluminum oxide layer is dense and formed of a material which prevents movement or diffusion of a material, the exposed sidewall surface of the first metal film pattern 310 can be protected from a harmful or reactive material, e.g., fluorine, which may be generated in the subsequent deposition process.

The SiN or SiON layer also can have a high step coverage by virtue of the process characteristics of the chemical vapor deposition or plasma deposition. Similar to the aluminum oxide layer, the SiN or SiON layer also can protect the exposed sidewall surface of the first metal film pattern 310 from the harmful or reactive material, e.g., fluorine, which may be generated in the subsequent deposition process.

Figure 8:
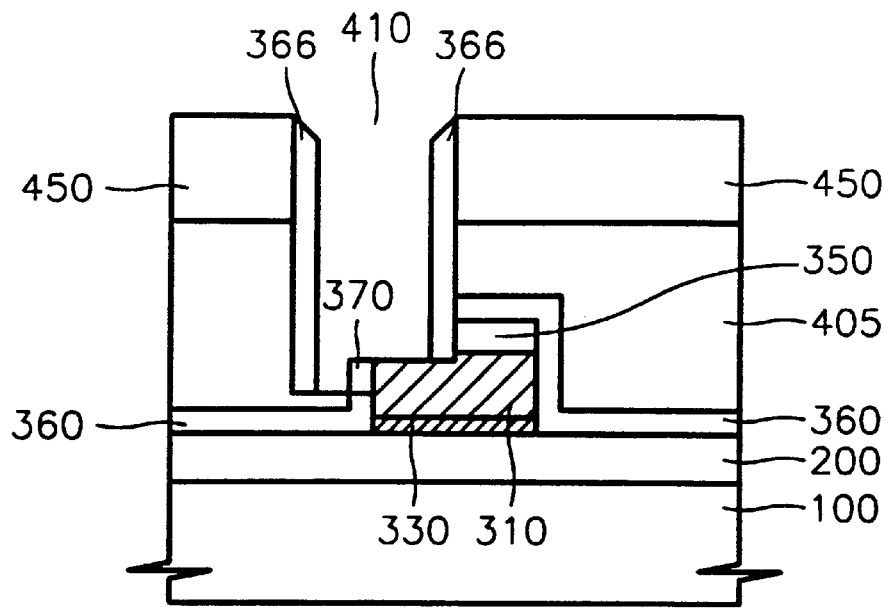

Referring to FIG. 8, part of the protection layer 365 covering the upper surface of the first metal film pattern 310 is selectively removed by anisotropically etching the entire surface of the protection layer 365. Here, an inductively coupled plasma method or an RF sputtering method is used as the anisotropic etch method. In such an anisotropic etch method, the bottom of the contact hole 410 is selectively etched out by its process characteristics.

At this time, a part of the protection layer covering the upper surface of the first metal film pattern 310 is also selectively etched out. However, another part of the protection layer 370 covering the sidewall surface of the first metal film pattern 310 remains. That is, a first protection spacer 370 covering the sidewall of the first metal film pattern 310 is formed. A second protection spacer 366 also remains on the sidewall of the contact hole 410.

Figure 9:
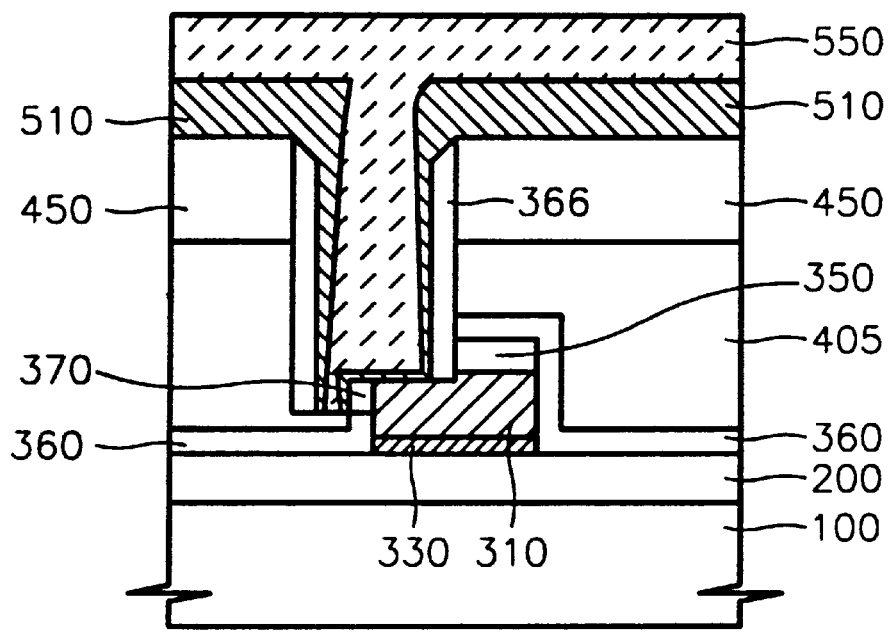

Referring to FIG. 9, an adhesion layer 510 is formed in the contact hole 410 and covers the exposed upper surface of the first metal film pattern 310. The adhesion layer 510 can be formed by depositing a titanium layer, a titanium nitride layer and a titanium/titanium nitride layer in situ. Here, several methods can be used, but it is preferable that a physical vapor deposition method using a collimator is used.

A second metal layer 550 for filling the contact hole is formed on the adhesion layer 510. The second metal layer 550 is formed using a source gas which generates a reactive material. For example, the second metal layer 550 is formed of tungsten by using a source gas containing fluorine, such as tungsten hexafluoride gas. The tungsten is deposited by chemical vapor deposition (CVD).

In the case that the tungsten layer is formed, the protection spacer 370 prevents damage to the first metal film pattern 310 due to the fluorine in the source gas. That is, the protection spacer 370 covers the sidewall surface of the first metal film pattern 310 exposed by the misalignment, and is formed of aluminum oxide, SiN, or SiON which is dense and prevents movement or diffusion of a material. Accordingly, the protection spacer 370 prevents a reactive material, such as fluorine, which is generated during the forming of the tungsten layer, from being moved or diffused to the first metal film pattern 310. Thus, an increase in the resistance of the first metal film pattern 310 due to damage by the harmful and reactive material, e.g., fluorine, can be avoided, and an increase in the contact resistance at the interface between the first metal film pattern 310 and the second metal layer 550 also can be suppressed and avoided.

As described above, after the second metal layer 550 is formed, it is patterned or flattened by etch back or chemical mechanical polishing, thereby forming a contact plug.

According to the present invention described above, a metal film pattern to be used as an interconnection line can be prevented from being damaged by a harmful or a reaction material such as fluorine contained in a dielectric layer. Also, when a second metal layer such as a contact plug to be connected to the metal film pattern is formed, the metal film pattern can be protected from damage by a harmful or reaction material, e.g., fluorine, contained in a reaction gas used to form the second metal layer. In particular, a lower metal film pattern exposed by misalignment that is liable to occur when the edge of the contact hole has a small process margin, i.e., when the process margin of the contact hole is significantly narrow, can be prevented from being damaged by a harmful or reactive material such as fluorine. Accordingly, an increase in the resistance of the metal film pattern to be used as an interconnection line or in the contact resistance between the metal film pattern and the contact plug due to the damage can be prevented and avoided. Therefore, the integrity and reliability of the interconnection line is maintained if not improved, thereby preventing and avoiding a defect in semiconductor devices.

Thus, a metal line structure for a semiconductor device has been described according to the present invention. While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A semiconductor device comprising:
   a first dielectric layer formed on a semiconductor substrate;

a first metal film pattern formed on the first dielectric layer;

an interface protection layer formed on the first metal film pattern, wherein the interface protection layer is formed of aluminum oxide, silicon nitride, or silicon oxynitride;

a second dielectric layer formed covering the interface protection layer and the first metal film;

a contact hole extending through the second dielectric layer and the interface protection layer to the first metal film pattern;

a protection spacer formed of aluminum oxide, silicon nitride or silicon oxynitride, covering at least one of the side walls of the contact hole and the first metal film pattern; and a second metal layer formed on the second dielectric layer and extending into and filling the contact hole.

2. The semiconductor device as claimed in claim 1, wherein the second dielectric layer contains fluorine.

3. The semiconductor device as claimed in claim 2, wherein the second dielectric layer is a silicon oxyfluoride layer.

4. The semiconductor device as claimed in claim 1, further comprising a diffusion barrier layer between the metal film pattern and the first dielectric layer.

5. The semiconductor device as claimed in claim 1, further comprising an anti-reflection layer on the metal film pattern.

6. The semiconductor device as claimed in claim 5, wherein the anti-reflection layer is formed of at least one of titanium or titanium nitride.

7. The semiconductor device as claimed in claim 1, further comprising an adhesion layer formed on the second dielectric layer and along the side walls and bottom walls of the contact hole.

8. The semiconductor device as claimed in claim 7, wherein the adhesion layer is a double layer formed by stacking a titanium layer and a titanium nitride layer.

9. The semiconductor device as claimed in claim 7, further comprising a third dielectric layer on the second dielectric layer, wherein the contact hole extends through the third and second dielectric layer and the interface protection layer to the first metal film pattern, and the adhesion layer is formed on the third dielectric layer and along the side walls and bottom walls of the contact hole.

* * * * *